United States Patent [19]

Schwent et al.

[11] Patent Number: 5,438,684
[45] Date of Patent: Aug. 1, 1995

[54] RADIO FREQUENCY SIGNAL POWER AMPLIFIER COMBINING NETWORK

[75] Inventors: Dale G. Schwent, Hoffman Estates; Rashid M. Osmani, Carol Stream; Robert N. Weisshappel, Barrington, all of Ill.

[73] Assignee: Motorola, Inc., Schaumburg, Ill.

[21] Appl. No.: 209,697

[22] Filed: Mar. 10, 1994

Related U.S. Application Data

[63] Continuation of Ser. No. 850,614, Mar. 13, 1992, abandoned.

[51] Int. Cl.[6] .............................................. H04B 1/04
[52] U.S. Cl. ...................................... 455/89; 455/93; 455/127; 330/124 R; 330/295; 375/216
[58] Field of Search ................ 455/89, 93, 95, 102, 455/103, 116, 126, 127; 375/5; 330/51, 124 R, 126, 744, 295

[56] References Cited

U.S. PATENT DOCUMENTS

| | | | |
|---|---|---|---|
| 4,959,873 | 9/1990 | Flynn | 455/303 |
| 5,008,631 | 4/1991 | Scherer et al. | 330/51 |
| 5,060,294 | 10/1991 | Schwent | 455/93 |
| 5,175,871 | 12/1992 | Kunkel | 455/127 |
| 5,179,353 | 1/1993 | Miyake | 455/116 |

FOREIGN PATENT DOCUMENTS 0219215  9/1988  Japan ...................... 330/295

*Primary Examiner*—Reinhard J. Eisenzopf
*Assistant Examiner*—Chi H. Pham
*Attorney, Agent, or Firm*—John J. King; Dale B. Halling; Rolland R. Hackbart

[57] ABSTRACT

A dual-mode RF signal power amplifier combining network is comprised of two branches, each having a power amplifier (200 and 201). The first branch contains a non-linear mode power amplifier (200) while the second branch contains a linear mode power amplifier (201). The non-linear mode branch also has an RF switch (210). Both branches are coupled to a common output node (220). The common node (220) is coupled to a filter (107) before going to an antenna (106). The non-linear mode power amplifier (200) operates when an FM signal is to be amplified, while the linear amplifier (201) is biased in an off state. The linear mode power amplifier (201) operates when a digital signal is to be amplified, while the non-linear amplifier (200) is biased in an off state. The RF switch (210) removes the non-linear amplifier (200) from the circuit to prevent loading the on state linear amplifier (201).

9 Claims, 3 Drawing Sheets

RADIO FREQUENCY SIGNAL POWER AMPLIFIER COMBINING NETWORK

This is a continuation of application Ser. No. 07/850,614, filed Mar. 13, 1992 and now abandoned.

FIELD OF THE INVENTION

The present invention relates generally to the field of amplifiers and particularly to amplifier switching.

BACKGROUND OF THE INVENTION

The rapid expansion of the number of cellular radiotelephones coupled with the desire to provide additional services has prompted the use of an improved transmission technique, called time division multiple access (TDMA). TDMA increases cellular system capacity over the current U.S. analog AMPS cellular system (Electronics Industries Associates Standard EIA-553) through the use of digital modulation and speech coding techniques. A TDMA signal transmission for the U.S. digital cellular system (Electronics Industries Associates Standard IS-54) is comprised of a continuous series of time slots. A radiotelephone operating in the U.S. digital cellular system only uses every third time slot.

A linear modulation technique, called π4 differential quadrature phase shifted keying (π/4 DQPSK), is used to transmit the digital information over the cellular radio channel. The use of linear modulation in the U.S. digital cellular system provides spectral efficiency allowing the use of 48.6 kbps channel data rates. π/4 DQPSK transmits the data information by encoding consecutive pairs of bits, commonly known as symbols, into one of four phase angles (±π4, ±3π/4) based upon gray encoding. These angles are then differentially encoded to produce an eight point constellation.

Transmitters designed for use in the U.S. digital cellular system are required to operate in both the TDMA digital mode and FM analog mode, referred to as dual mode operation. The TDMA digital mode uses the π/4 DQPSK modulation, and can be implemented using a linear transmitter. The FM analog mode uses conventional frequency modulation and allows the use of higher efficiency non-linear transmitters.

The linear transmitter is relatively inefficient in terms of average power out when operated non-linearly in the FM analog mode, but this is not as severe a problem in the TDMA digital mode since the linear transmitter is switched on with a one-third duty cycle. In other words, the linear transmitter is only on for one out of every three time slots in the TDMA digital mode. Since the linear transmitter is on only one third of the time, current drain in the linear transmitter may be actually less than that of continuously-operated non-linear transmitters in existing FM products.

There is a problem, however, when the linear transmitter is operated continuously in the FM analog mode at the same average power level as in the TDMA digital mode. The linear transmitter will have relatively poor efficiency and will draw much more current than conventional non-linear transmitters. As a result, there is a need for an efficient dual mode power amplifier network for use in both TDMA digital mode and FM analog mode.

SUMMARY OF THE INVENTION

The present invention encompasses a power amplifier combining network. This network is comprised of a plurality of amplifying devices. Each amplifying device is coupled to an output transmission line. A common node couples all the output lines. Additionally, a switching device is located in series with at least one output transmission line between the common node and the amplifying device.

DETAILED DESCRIPTION OF THE PREFERRED EMBODIMENTS

Figure 1:
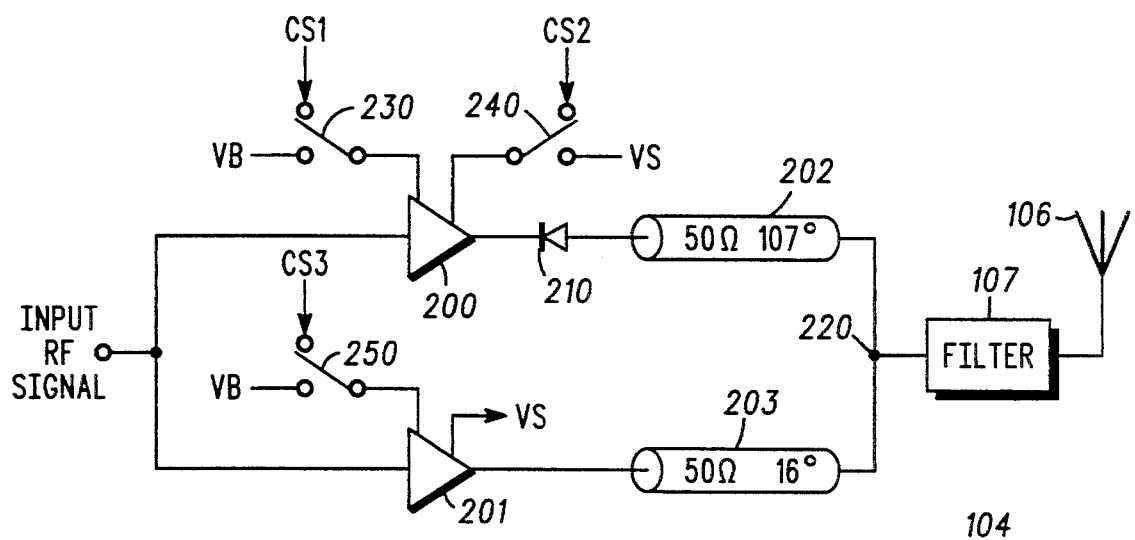
FIG. 1 shows the preferred embodiment of the power amplifier combining network of the present invention.

The power amplifier combining network of the present invention enables a radio-frequency (RF) communication device to operate efficiently in both the FM analog mode and the TDMA digital mode. The preferred embodiment, illustrated in FIG. 1, is comprised of a single input RF signal line including an analog RF signal and a digital RF signal, that splits out into two branches. In other embodiments the single input RF signal line may be two separate input RF signal lines. Each input RF signal path contains a separate power amplifier.

The first branch contains a non-linear mode power amplifier (200), while the second branch contains a linear mode power amplifier (201). The non-linear mode branch also has an RF switch (210). Both branches are coupled to a common output node (220). The common node (220) is coupled to a filter (107) before going to an antenna (106). The nonlinear mode power amplifier (200) operates when an FM signal is to be amplified, while the linear amplifier (201) is biased in an off state. The linear mode power amplifier (201) operates when a digital signal is to be amplified, while the non-linear amplifier (200) is biased in an off state. The RF switch (210) removes the non-linear amplifier (200) from the circuit to prevent loading the on state linear amplifier (201).

The power amplifier (200) in the first branch is designed for high efficiency non-linear amplification, referred to as saturation mode operation (for example, class C mode). An example of such an amplifier being a two stage Fujitsu type FMC080802-20 GaAs FET power amplifier module. The power amplifier (201) in the second branch is designed for linear amplification, referred to as linear mode operation (for example, class AB mode). An example of such an amplifier is a two stage Motorola type SFIW5096 bipolar power amplifier module. In the preferred embodiment, the linear amplifier (201) is used to amplify $\pi/4$ DQPSK modulated TDMA RF signals, while the non-linear amplifier (200) amplifies FM RF signals.

The output of either one of the amplifiers may be coupled to an RF switch (210). In the preferred embodiment, the switch (210) is a PIN diode and is coupled to the non-linear amplifier (200). The output line of the linear amplifier (201) and the RF switch (210) are coupled together at a common node (220). In the preferred embodiment, the output lines are transmission lines (203 and 203). The output line of the linear amplifier (201) is a 50 $\Omega$, 16° transmission line (203) and the output line of the non-linear amplifier (200) is a 50 $\Omega$, 107° transmission line (202). The common node (220) is then coupled to a filter (107) that is then coupled to an antenna (106).

Since both inputs of the power amplifiers (200 and 201) are coupled together, without some kind of control, both amplifiers (200 and 201) would generate an output simultaneously. This control is accomplished by the biasing of the amplifiers (200 and 201) in addition to the RF switch (210) at the output of the non-linear amplifier (200).

The amplifier to be used is biased normally, while the other is biased such that a highly reactive load is presented at its output. This alternate biasing is done with switches (230, 240, and 250) to turn the bias and/or supply voltages on, or off (ie. floating), of one or more of the amplifiers' VB and/or VS input pins. Switches (230, 240, and 250) may be conventional analog switches (eg. Motorola type MC14551 analog switches) having a control signal input. In the preferred embodiment, the bias and supply voltage switching is accomplished with switches (230, 240, and 250) since they are more current drain efficient than PIN diodes.

To illustrate the use of the power amplifier combining network of the present invention, it is first assumed that a hybrid digital/analog radiotelephone using the power amplifier combining network is operating in the U.S. Digital Cellular system. The radiotelephone's microcontroller selects the TDMA digital mode of the radiotelephone by controlling the switches (230, 240, and 250) by means of the corresponding control signals (CS1, CS2, and CS3). The switches (230 and 240) to the non-linear power amplifier (200) are opened by the control signals (CS1 and CS2), thus allowing the VB and VS input pins of the GaAs FET power amplifier to float. Switch (240) is operated before switch (230) to remove the supply voltage VS before the bias voltage VB. Next, the bias voltage VB input of the linear power amplifier (201) is switched (250) to 5.5 V by the control switch (CS3) while the collector input is held at 6 V.

The non-linear power amplifier (200) is a short circuit when the bias and supply voltage inputs (VB and VS) float since it is a depletion mode FET, necessitating a switch for the drain supply. The floating non-linear power amplifier (200) presents its maximum output impedance at the common node (220), minimally loading the linear power amplifier (201). In this condition, the floating non-linear power amplifier (200) has about 55 dB of bleedthrough isolation, therefore, full power may be applied to the floating non-linear power amplifier without having any significant effect on its output. The loading due to the floating non-linear power amplifier (200) causes a 0.6 dB drop in output power of the linear power amplifier (201), which degrades the two tone spur ratio by only about 4 dBc at the same power out. This minor degradation can be remedied by re-optimizing the linear power amplifier (201) to a slightly higher power out.

For operation in the analog cellular system, the switch (250) to the bias voltage VB input pin of the linear power amplifier (201) is opened first by the control signal (CS3) causing this VB input pin to float. Then, the control signal (CS2) closes the switch (240) to apply the 6 V drain supply voltage VS to the non-linear power amplifier (200), and shortly thereafter the control signal (CS1) closes the switch (230) to apply the $-4.2$ V gate supply voltage VB to the non-linear power amplifier (200).

The floating bias voltage VB input pin causes the linear amplifier (201) to present its maximum output impedance, approximately 1.9 dB at $-147°$, at the common node (220), minimally loading the non-linear power amplifier (200). In this condition, the floating linear power amplifier (201) has about 60 dB of bleedthrough isolation, so that full input power may be applied to the floating linear power amplifier without having any significant effect on its output. Further isolation of the floating linear power amplifier (201) could be attained by means of a PIN diode switch in series with output line 203. The presence of the floating linear power amplifier (201) causes a 0.3 dB drop in output power of the non-linear power amplifier (200). This degradation increases current drain by 30 mA at the same power out, if efficiency stays constant over power out. In practice, efficiency actually improves slightly making the current drain about the same. The 16° output transmission line (203) rotates the output impedance of the floating linear power amplifier (201) to its maximum output impedance at the common node (220).

Figure 7:
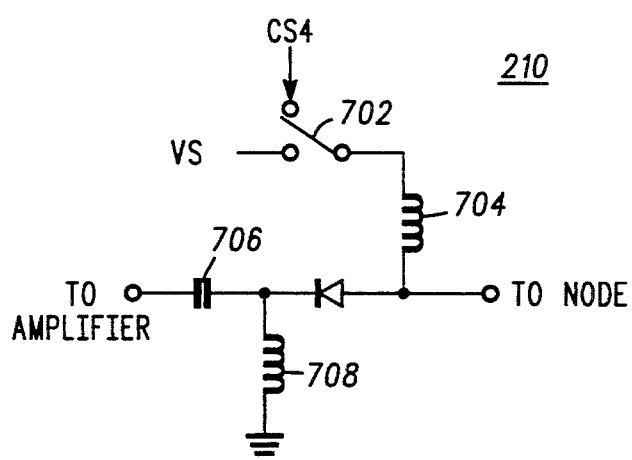
FIG. 7 shows a detailed circuit diagram of the RF switch in the power amplifier combining network in FIG. 1.

Referring to FIG. 7, there is illustrated a detailed circuit diagram of the RF switch (210). The RF switch (210) includes a PIN diode which is turned on when the switch (704) is closed by the control signal (CS4) connecting the 4.8 VS supply voltage in the inductor (704). When the PIN diode is turned on the path between the amplifier (200) and the node (220) is closed. Conversely, the PIN diode is turned off when switch (704) is opened by control signal (CS4). When the PIN diode is turned off the path between amplifier (200) and node (220) is opened.

The RF switch (210), a PIN diode in the preferred embodiment, is located in series with the output of the non-linear power amplifier (200). Since the non-linear amplifier (200) that is in the floating state may load the linear amplifier (201) that is in the on state, it is desirable that the floating non-linear amplifier (200) be an open circuit to the linear amplifier (201). The RF switch (210) isolates the floating non-linear amplifier (200) without making any modifications to the existing linear amplifier module (201). The use of this switch (210) allows the power amplifier combining network to be implemented with conventional power amplifier modules that can not be biased into acceptable low-loss states when not is use. In the preferred embodiment, the bias voltage VB to the non-linear power amplifier is still switched off to eliminate its quiescent current drain.

Figure 3:
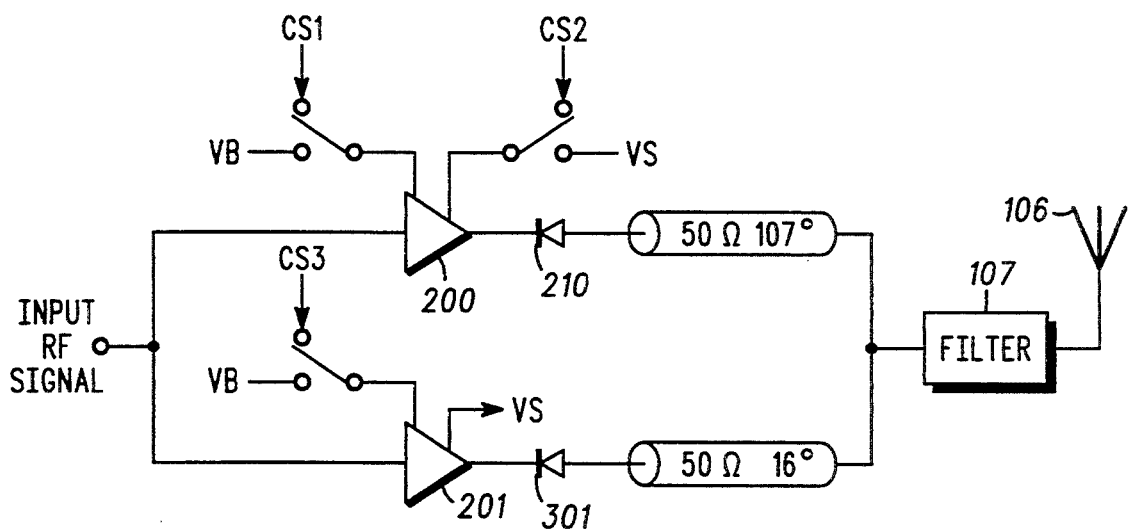
FIG. 3 shows another alternate embodiment of the power amplifier combining network of the present invention.

An alternate embodiment, illustrated in FIG. 3, includes PIN diode switches (210 and 301) in series with both power amplifier outputs. This allows the use of two conventional power amplifiers that can not be biased into acceptable low-loss states when not in use. In other alternate embodiments, PIN diode switches may be in series with the input RF signal lines coupled to the power amplifiers.

In another alternate embodiment, the TDMA digital mode, which uses the linear power amplifier (201), may be enabled by biasing the gate of the non-linear power amplifier (200) more negatively to shut the GaAs FET device off. With the gate bias voltage VB at the negative value of the drain supply voltage VS, the output return loss is closer to 0 dB in magnitude and 0° but positive in phase, thereby allowing for a shorter output transmission line. In this configuration, however, the RF voltage applied by the linear power amplifier (201) to the GaAs FET drain of the non-linear power amplifier (200) may drive the FET into drain-gate breakdown, causing the output impedance of the non-linear power amplifier to approach 50Ω. This limitation is only due to the breakdown characteristics of currently available GaAs FET devices. If a FET device having sufficient breakdown voltage or having an output match that does not result in a high RF voltage across the device becomes commercially available, an embodiment which switches the gate bias voltage VB of the non-linear power amplifier to a more negative value may be implemented with such devices.

Figure 2:
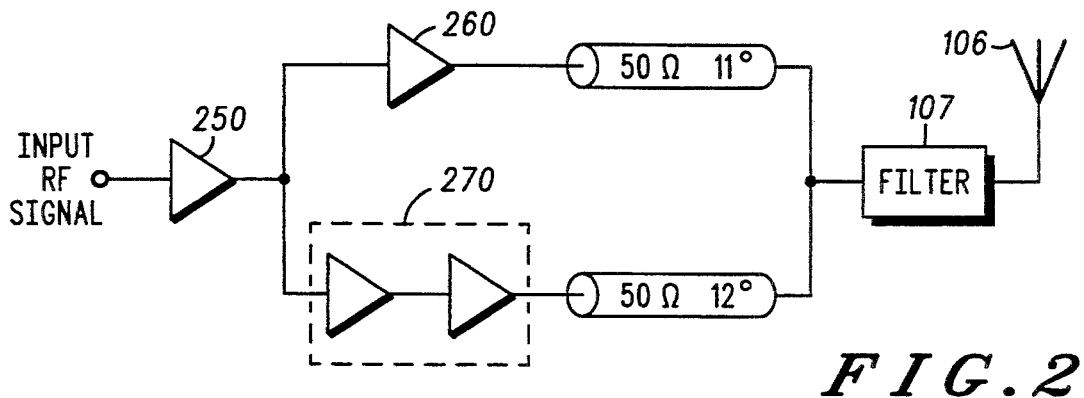
FIG. 2 shows an alternate embodiment of the power amplifier combining network of the present invention.

Another alternate embodiment illustrated in FIG. 2 is comprised of a linear driving amplifier (250) whose output drives two branches of power amplifiers (260 and 270). One branch has a single-stage GaAs FET amplifier (260) for the non-linear power amplifier. The second branch has a two-stage bipolar power amplifier (270) for the linear power amplifier. Both outputs are coupled to a common node through 50Ω output transmission lines before being coupled to an antenna (106) through a filter (107).

In the embodiment shown in FIG. 2, since a GaAs FET amplifier has higher gain per stage than a bipolar power amplifier, FM output power requirement of the driving amplifier (250) is close to its peak power requirement in the TDMA digital mode. The driving amplifier (250) can have good FM efficiency at its peak power out. This, coupled with a high efficiency GaAs FET non-linear power amplifier (260) would make a very efficient transmitter in the FM analog mode.

Figure 4:
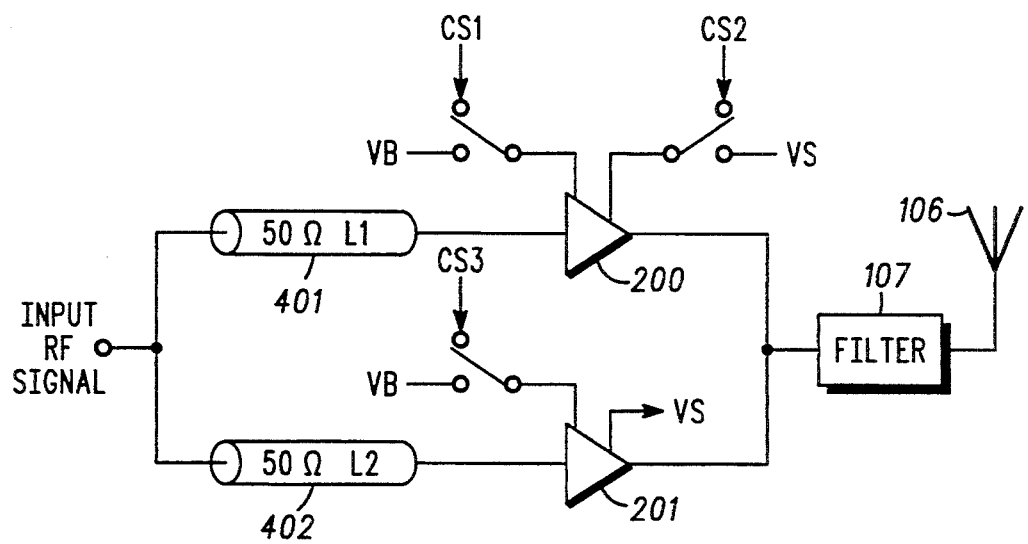
FIG. 4 shows still another alternate embodiment of the power amplifier combining network of the present invention.

Yet another embodiment of the power amplifier combining network of the present invention is illustrated in FIG. 4. In this embodiment, the input impedance of the power amplifiers is switched to a highly reactive state when that respective amplifier is not used. By proper choice of the input transmission lines (401 and 402), an open circuit impedance can be presented to the input RF signal splitting junction, causing power to be diverted from the floating amplifier to the in-use amplifier. As in the preferred embodiment, a PIN diode switch may be used in one or both branches if a selected conventional power amplifier device can not be biased into a suitable low-loss state, or if the required input transmission line lengths can not be practically implemented.

Figure 5:
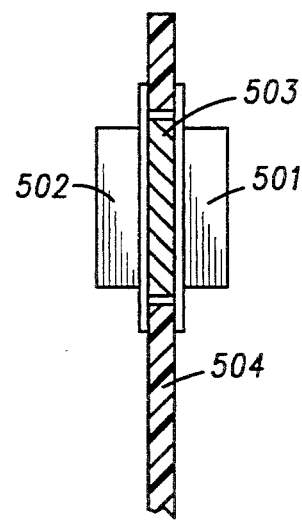
FIG. 5 shows a mounting configuration for the power amplifiers of the present invention on a printed circuit board.

In FIG. 5, two power amplifier modules (501 and 502) used for power amplifiers (200 and 201) in FIG.1 are mounted back to back on a printed circuit board (504) by way of two screws or other suitable bonding means. This type of mounting substantially reduces the required amount of printed circuit board space, since the back side of each power amplifier module (501 or 502) is typically not used for any purpose other than heat sinking. In this case, only one power amplifier module (501 or 502) is on at a time, so the back sides of both power amplifier modules (501 and 502) can be used to heat sink the module that is on. Additionally, the power amplifier modules (501 and 502) could share a common heat sink (503), reducing the cost, weight, and complexity of the radio, as heat sinks are typically expensive and difficult items to implement in a radio, particularly a lightweight portable device.

Figure 6:
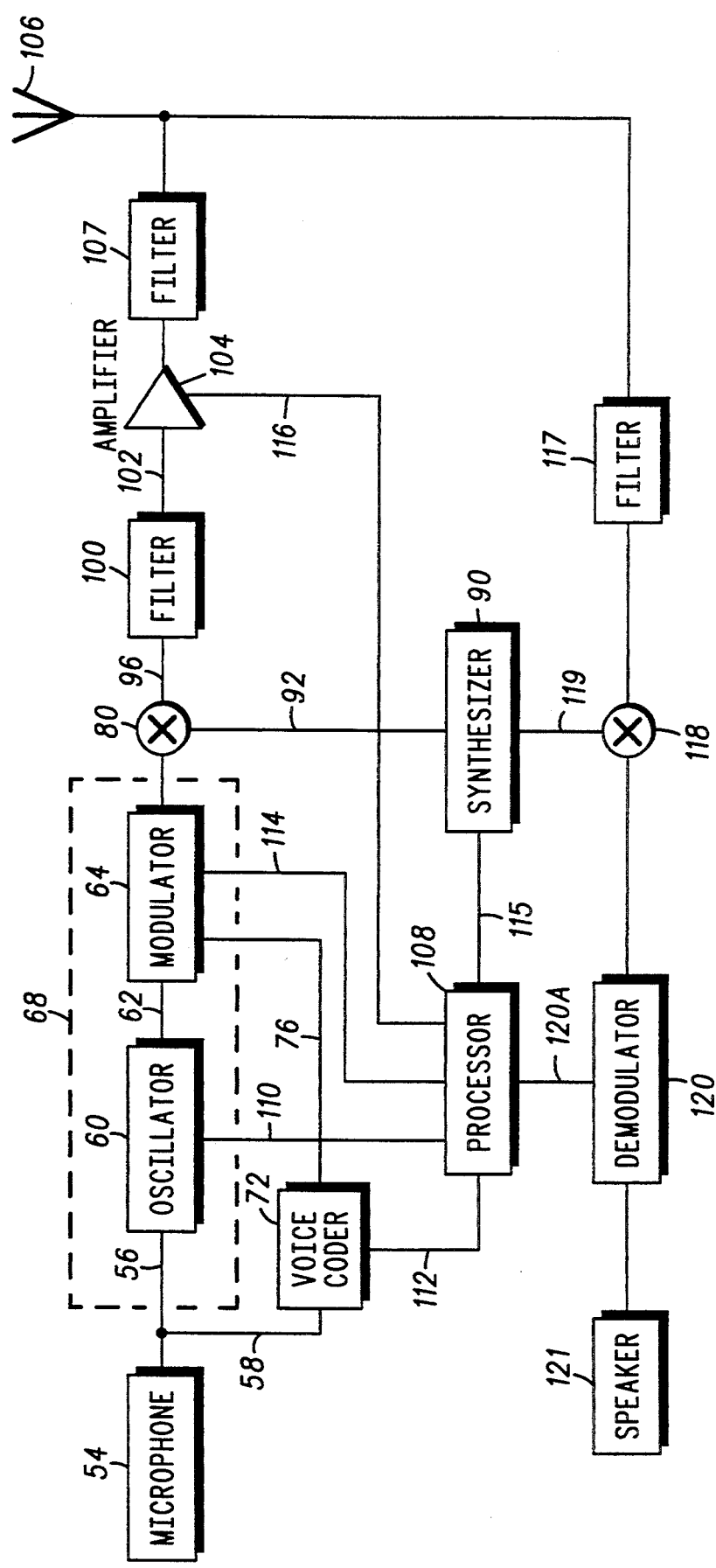
FIG. 6 shows a block diagram of a typical radiotelephone in accordance with the present invention.

FIG. 6 illustrates a block diagram of a dual-mode radiotelephone incorporating the transmitter of the present invention. The actual circuitry embodying the functional blocks of the diagram may be disposed upon one or more circuit boards and housed within a conventional radiotelephone housing. The transmitter (104) includes the power amplifier combining network of the present invention for operation of the dual-mode radiotelephone in either the TDMA digital mode or the FM analog mode. Efficient amplification of a frequency modulated signal, and amplification of a $\pi/4$ DQPSK modulated signal is thereby possible, while, at the same time, minimizing circuit size and cost.

The microphone (54) converts voice signals supplied thereto into an electrical, information signal, and generates an output indicative thereof (56 and 58).

The information signal supplied on line (56) is utilized when, similar to conventional cellular, radiotelephone communications, a frequency modulated information signal is to be generated by the radiotelephone. The information signal supplied on line (58) is utilized when a discrete, encoded signal modulated to form a composite modulated information signal is to be generated by the radiotelephone.

The information signal generated on line (56) is supplied to a voltage controlled oscillator (60) where the information signal is combined with an oscillating signal of a certain frequency. A frequency modulated information signal (62) is generated by the voltage controlled oscillator (60) to a modulator (64). When the radiotelephone is to transmit a frequency modulated information signal in the FM analog mode, the modulator (64) does not alter the frequency modulated information signal (62), but, rather, "passes-through" the frequency modulated information signal. The oscillator (60) and modulator (64) may together comprise a hybrid modulation apparatus (68).

The information signal (58) is supplied to a vocoder (72) where the analog information signal is digitized and encoded according to an encoding scheme, and generates a discrete, encoded signal (76) that is supplied to the modulator (64). The modulator (64) modulates the discrete, encoded signal (76) to form a composite, modulated information signal of a predetermined frequency in the TDMA digital mode.

The modulated information signal modulated according to either a frequency modulation technique or a composite modulation technique, is supplied to a mixer (80). The mixer (80) mixes this signal with an offset transmission-frequency carrier wave generated by a synthesizer (90) and supplied to the mixer (80). The mixer (80) mixes the modulated information signal with the carrier wave (92). The mixer (80) then generates a modulated information signal (96) upon a carrier wave of a carrier frequency determined by the oscillating frequency of synthesizers (90 and 60).

The modulated information signal (96) is coupled to a filter (100) that forms a passband of frequencies centered about, or close to, the carrier frequency of the transmitted wave. This filter (100) generates a filtered signal (102), containing the modulated information signal, that is coupled to the power amplifier (104) incorporating the present invention. The power amplifier (104) amplifies the modulated information signal to power levels adequate for transmission through an antenna (106). Prior to transmission of the amplified signal, and as illustrated, the amplified signal may be filtered by another filter (107) that may, for example, form a portion of a duplexer. This filter (107) is positioned in-line between the power amplifier (104) and the antenna (106).

A processor (108) provides control signals (110, 112, 114, and 115) to control operation of the oscillator (60), the vocoder (72), the modulator (64), and the synthesizer (90), respectively, to control modulation of the information signal generated by the microphone (54).

The processor (108) controls whether the information signal generated by the microphone (54) is modulated by the oscillator (60) to form a frequency modulated information signal in the FM analog mode, or alternately, is encoded by the vocoder (72) according to a discrete encoding scheme and modulated by the modulator (64) to form a composite modulated information signal in the TDMA digital mode.

As the modulated signals supplied to the amplifier (104), in the preferred embodiment, are frequency modulated or composite modulated information signals, the processor (108) supplies the control signals (CS1, CS2, CS3, and CS4) on the lines (116) to the amplifier (104) to cause operation of the amplifier (104) in either the FM analog mode or the TDMA digital mode. The TDMA digital mode is enabled when a $\pi/4$ DQPSK modulated signal is to be transmitted and the FM analog mode is enabled when an FM signal is to be transmitted.

FIG. 6 further illustrates the radiotelephone receive circuit for a signal transmitted to the antenna (106). The signal transmitted to the antenna (106) is supplied to the filter (117) which passes signals of desired frequencies to the mixer (118). The mixer (118) receives an oscillating signal (119) from the synthesizer (90) and generates a mixed signal that is supplied to a demodulator (120). The demodulator (120) supplies a demodulated, electrical information signal to a speaker (121). The processor (108) may supply a signal (120A) to the demodulator (120) to control its operation. The speaker (121) converts the electrical information signals into audible signals.

We claim:

1. A radio frequency (RF) signal power amplifier combining network responsive to a control signal for operation in a linear mode or a saturation mode, said RF signal power amplifier combining network comprising:
    a first amplifier for amplifying a first RF signal in the linear mode;
    a second amplifier for amplifying a second RF signal in the saturation mode, the second amplifier coupled to the first amplifier in an electrically parallel configuration;
    first and second output transmission lines coupled to the first and second amplifiers, respectively;
    a common node that couples the first and second output transmission lines; and
    a switch in series with at least one of the first and second output transmission lines and responsive to the control signal for coupling or decoupling the corresponding one of the first and second amplifiers and the common node.

2. The RF signal power amplifier combining network of claim 1 wherein the switch is a PIN diode in series with the at least one of the first and second output transmission lines.

3. The RF signal power amplifier combining network of claim 1 and further including a second common node for combining inputs of the first and second amplifiers into a single input RF signal line.

4. The RF signal power amplifier combining network of claim 1 and further including first and second biasing means coupled to the first and second amplifiers, and being responsive to the control signal for coupling and decoupling different bias voltages to the first and second amplifiers.

5. The RF signal power amplifier combining network of claim 4 wherein the first RF signal is a differential quadrature phase shifted keying (DQPSK) modulated input RF signal, the second RF signal is a frequency modulated (FM) input RF signal, the first amplifier applies a gain greater than unity to a DQPSK modulated input RF signal, and the second amplifier applies a gain greater than unity to an FM input RF signal.

6. The RF signal power amplifier combining network of claim 1 wherein the first output transmission line is a 16° transmission line and the second output transmission line is a 107° transmission line.

7. The RF signal power amplifier combining network of claim 1 wherein the common node is coupled to an antenna that radiates the amplified RF signal from the first and second amplifiers.

8. A radio frequency (RF) signal power amplifier combining network responsive to a control signal for operation in a linear mode or a saturation mode, said RF signal power amplifier combining network comprising:
    first and second RF signal input lines;
    a first common node coupling the first and second RF signal input lines;
    a first amplifier for amplifying a first RF signal, on the first RF input signal line, in a linear mode and a second amplifier in parallel with said first amplifier for amplifying a second RF signal, on the second RF input signal line, in a saturation mode;
    a switch coupled to an output of the second amplifier;
    a first output transmission line coupled to the first amplifier and a second output transmission line coupled to the switch, the switch responsive to the control signal for coupling or de-coupling the second amplifier and the second output transmission line; and
    a second common node coupling the first and second output transmission lines.

9. A dual-mode radio frequency (RF) signal communications device comprising:
    control means for producing a control signal for operation in a linear mode or a saturation mode;
    a modulator for producing, in response to the control signal, a frequency modulated (FM) signal in the saturation mode and a time division multiple access (TDMA) signal in the linear mode;
    a power amplifier combining network, coupled to the modulator, comprising:
        a first amplifier for amplifying the TDMA signal;
        a second amplifier for amplifying the FM signal, the second amplifier coupled to the first amplifier in an electrically parallel configuration;
        a first and a second output transmission line coupled to the first and second amplifiers, respectively;
        a common node coupling the first and second output transmission lines; and
        a switch coupled in series with one of the first or second output transmission lines and responsive to the control signal for coupling or decoupling the corresponding one of the first or second amplifiers to the common node; and an antenna coupled to the common node.

* * * * *